United States Patent [19]

Ishimura

[11] Patent Number: 5,341,391
[45] Date of Patent: Aug. 23, 1994

[54] VARIABLE WAVELENGTH SEMICONDUCTOR LASER

[75] Inventor: Eitaro Ishimura, Itami, Japan

[73] Assignee: Mitsubishi Denki Kabushiki Kaisha, Tokyo, Japan

[21] Appl. No.: 51,887

[22] Filed: Apr. 26, 1993

[30] Foreign Application Priority Data

May 11, 1992 [JP] Japan .................. 4-146597

[51] Int. Cl.$^5$ .................................. H01S 3/19
[52] U.S. Cl. ........................... 372/46; 372/34; 372/45; 372/96
[58] Field of Search ............ 372/46, 20, 34, 50, 372/36

[56] References Cited

U.S. PATENT DOCUMENTS

| 5,140,605 | 8/1992 | Paoli et al. | 372/50 |
| 5,173,909 | 12/1992 | Sakano et al. | 372/20 |
| 5,262,658 | 11/1993 | Jankowski | 372/50 |

FOREIGN PATENT DOCUMENTS 62-247582 10/1987 Japan .
63-173380 7/1988 Japan .
1173686 7/1989 Japan .

OTHER PUBLICATIONS

Hitachi et al., "Wavelength Tunable DFB Laser With A Heater Wire On The Tip", Japan Society of Applied Physics and Related Societies, 1991, p. 969 (no month).

Primary Examiner—James W. Davie
Attorney, Agent, or Firm—Leydig, Voit & Mayer

[57] ABSTRACT

A semiconductor laser device has an active layer, a cladding layer, and a contact layer successively disposed on a semiconductor substrate. A pair of electrodes for passing a current parallel to the cladding and contact layers and perpendicular to the resonator direction of the active layer for heating the active layer are disposed opposite the stripe-shaped active layer. The pair of electrodes are disposed on the contact layer and the contact layer between the pair of electrodes is missing. One of the pair of electrodes may be disposed directly on the cladding layer. An improved wavelength change response property as a function of the active layer temperature controlling current flowing between the two electrodes is obtained. Further, the production of the laser is easy.

13 Claims, 7 Drawing Sheets

250
VARIABLE WAVELENGTH SEMICONDUCTOR LASER

FIELD OF THE INVENTION

The present invention relates to a semiconductor laser device that can oscillate at variable wavelengths and, more particularly, to a semiconductor laser that can be produced easily and that has a good wavelength change response characteristic as a function of wavelength controlling current.

BACKGROUND OF THE INVENTION

Figure 5A:
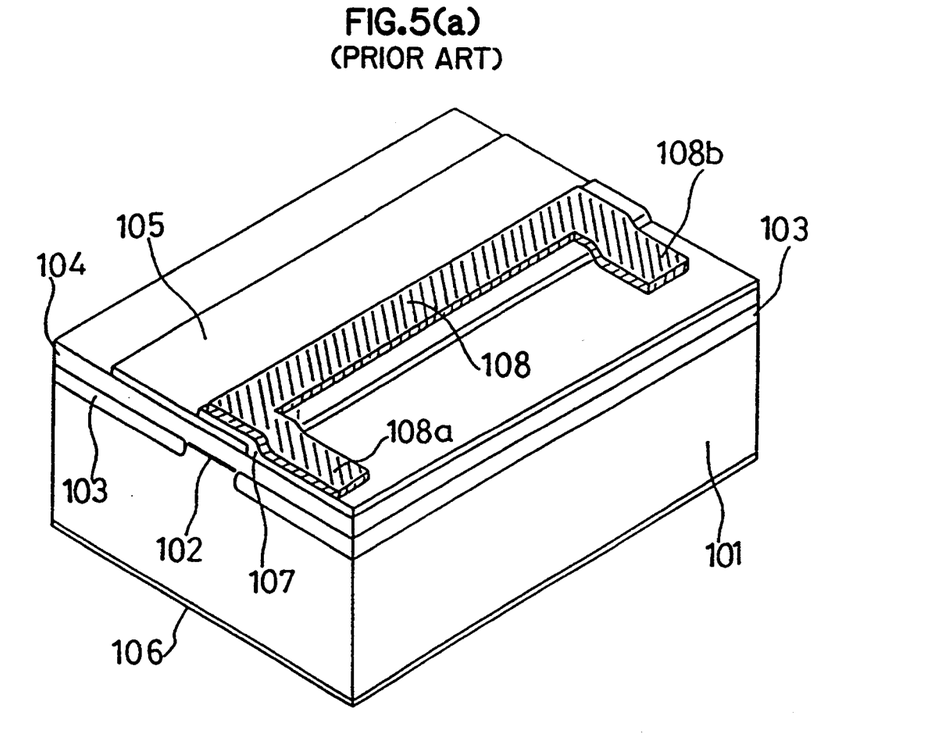
FIG. 5(a) is a perspective view showing a structure of a prior art semiconductor laser and FIG. 5(b) is a diagram showing a characteristic thereof.

FIG. 5(a) is a perspective view showing a structure of the prior art resistor film heating-type variable wavelength semiconductor laser disclosed in *Applied Physics,* Spring Meeting 1991, Prescript Number 3, page 969, 29p-D-8. In FIG. 5(a), reference numeral 101 designates an n-type semiconductor substrate. A stripe-shaped active layer 102 is disposed on the substrate 101 at the central portion of the laser element. A semi-insulating current blocking layer 103 is disposed on the substrate 101 at both sides of the active layer 102. A p-type semiconductor layer 104 is disposed on the current blocking layer 103 and the active layer 102. A p side electrode 105 and an n side electrode 106 for injecting a laser driving current are disposed on the front surface of the p-type semiconductor layer 104 and on the rear surface of the substrate 101, respectively. An insulating film 107 is disposed directly opposite the active layer 102 on the p side electrode 105 and a platinum resistor film 108 is disposed on the insulating film 107 at a position directly opposite the active layer 102.

When a bias voltage in a forward direction is applied to the p-n junction of the semiconductor laser through the p side electrode 105 and the n side electrode 106, charge carriers are injected into the active layer 102 and recombine in the active layer 102 to generate light. Here, the current blocking layer 103 is provided so that current is concentrated in the active layer 102. The light generated in the active layer 102 is guided along the active layer with repeated reflection and amplification, thereby producing laser oscillation.

Figure 5B:
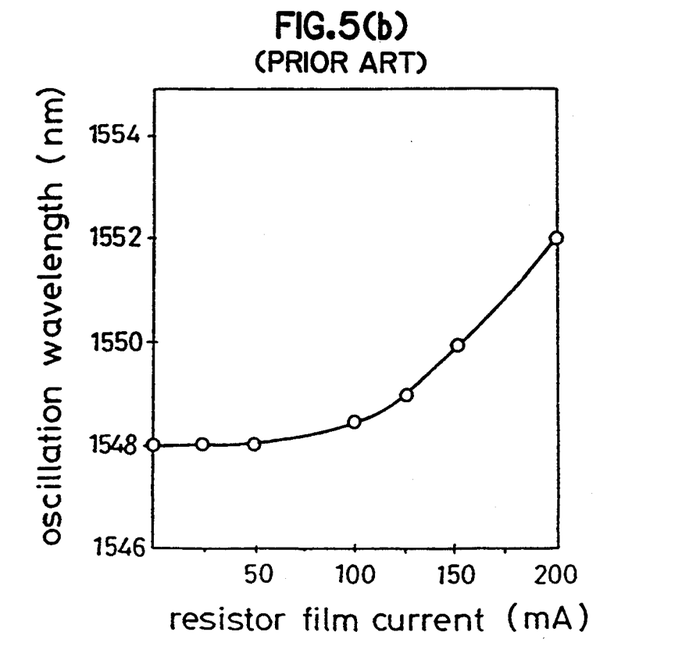

The oscillation wavelength of a semiconductor laser varies with the temperature of the active layer and when the temperature rises, the wavelength is generally lengthened because the band gap energy of the semiconductor of the active layer is narrowed, thereby shifting the wavelength to the longer wave-length side. The variable wavelength semiconductor laser of FIG. 5(a) utilizes this effect. In that laser device, the resistor film 108 generates heat when a current flows between the ends 108a and 108b of the resistor film 108, thereby heating the active layer 102. Therefore, when the current flowing through the resistor film 108 is increased, the temperature of the active layer 102 rises and the oscillation wavelength is shifted to the longer wavelength side, as shown in FIG. 5(b).

Figure 6:
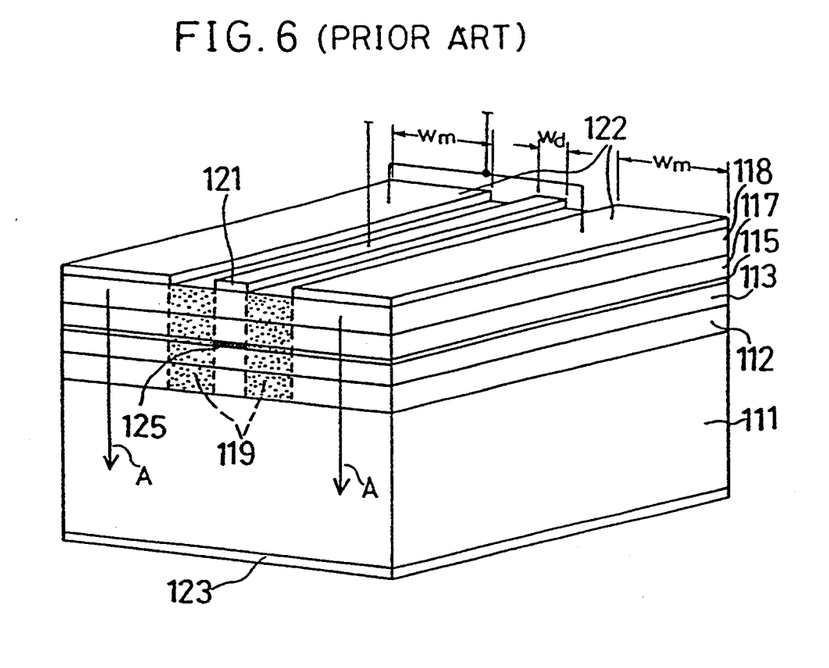
FIG. 6 is a perspective view showing another prior art semiconductor laser.

FIG. 6 is a perspective view of a prior art variable wavelength semiconductor laser disclosed in Japanese Published Patent Application 1-173686. In FIG. 6, reference numeral 111 designates an n-type GaAs substrate. An n-type GaAs buffer layer 112 is disposed on the substrate 111, an n-type AlGaAs cladding layer 113 is disposed on the buffer layer 112, a GaAs active layer 115 is disposed on the cladding layer 113, a p-type AlGaAs cladding layer 117 is disposed on the active layer 115, and a p-type GaAs cap layer is disposed on the cladding layer 117. A stripe-shaped laser driving electrode of width $w_d$ 121 is disposed on the cap layer 118 at a central portion of the laser element and temperature control electrodes of width $w_m$ ($w_m$ is significantly larger than $w_d$) is disposed on the cap layer 118 on both sides of and separated from the laser driving electrode 121. In the semiconductor laminated structures at regions between the laser driving electrode and the temperature control electrodes 122, respectively, ions, such as He ions, are implanted from the surface of the cap layer 118, reaching the semiconductor substrate 111 and producing high resistance regions 119. A common electrode 123 is disposed at the rear surface of the substrate 111. Reference numeral 125 designates a laser active region.

In this prior art device, laser oscillation occurs at the region 125 of the active layer 115 directly opposite the driving electrode 121 from an excitation current injected from the driving electrode 121. Further, since a region 125 of the active layer 115 directly opposite the temperature control electrode 122 has a large width, laser oscillation is not likely to occur there even if a current flows, as shown by arrows A. By making relatively large currents flow from the electrodes 122, the regions directly opposite the electrodes 122 can be used as heating materials. Accordingly, by controlling the temperature of the laser active region 125 directly opposite the driving electrode 121 for the active layer 115 with the heat generated at regions directly opposite the electrode 122, the laser oscillation wavelength can be controlled.

Figure 7:
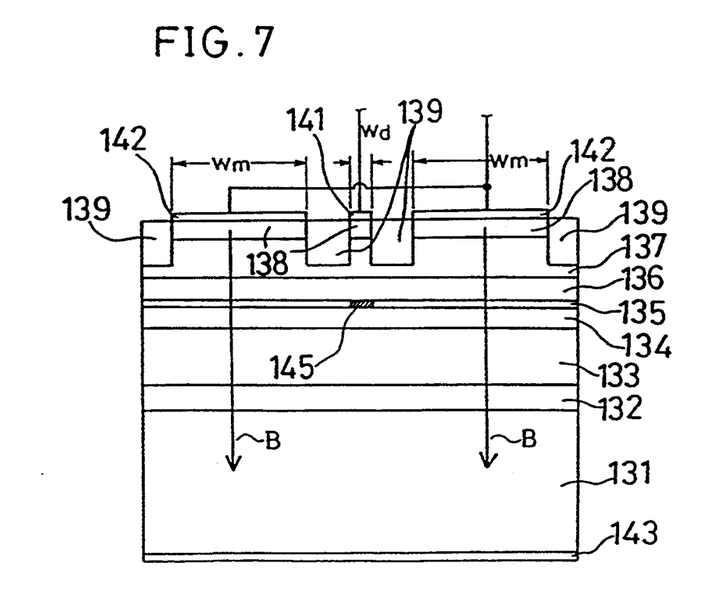
FIG. 7 is a cross-sectional view showing still another prior art semiconductor laser.

FIG. 7 is a cross-sectional view of another prior art variable wavelength semiconductor laser disclosed in Japanese Published Patent Application 1-173686. In FIG. 7, reference numeral 131 designates an n-type GaAs substrate. An n-type GaAs buffer layer 132 is disposed on the substrate 131, an n-type AlGaAs cladding layer 133 is disposed on the buffer layer 132, an n-type AlGaAs-GaAs graded layer 134 is disposed on the cladding layer 133, a GaAs active layer 135 is disposed on the graded layer 134, a p-type GaAs-AlGaAs graded layer 136 is disposed on the active layer 125, a p-type AlGaAs cladding layer 137 is disposed on the graded layer 136, and a p-type GaAs cap layer 138 is disposed on the cladding layer 137. A stripe-shaped laser driving electrode 141 of width $w_d$ is disposed on the cap layer 138 at a central portion of the laser element, and temperature control electrodes 142 of width $w_m$ ($w_m$ is significantly larger than $w_d$) are disposed on the cap layer 138 at both sides of the laser driving electrode 141. Grooves extending from the surface of the cap layer 138 to the cladding layer 137 are produced by etching where the laser driving electrode 141 is disposed and where the temperature control electrodes 142 are disposed, respectively, and the grooves are filled with insulating layers 139 comprising polyimide or the like. A common electrode 143 is disposed at the rear surface of the substrate 131. Reference numeral 145 designates a laser active region.

Also in this prior art device, similar to the semiconductor laser of FIG. 6, laser oscillation occurs at a region 145 directly opposite the driving electrode 121 of the active layer 135 from an excitation current injected from the driving electrode 141. Further, since the regions directly opposite the temperature control electrodes 142 of the active layer 135 have a large width, even when a current flows, as shown by the arrows B, from the electrode 142, laser oscillation is not likely to occur. A relatively large current flow from the electrode 142 through the regions directly below the electrode 142 can be used as a heat source. By controlling the temperature of the laser active region 145 of the active layer 135 directly opposite the driving electrode 141 with the heat generated at regions directly opposite the electrode 142, the oscillation wave-length of the laser can be controlled.

Figure 8:
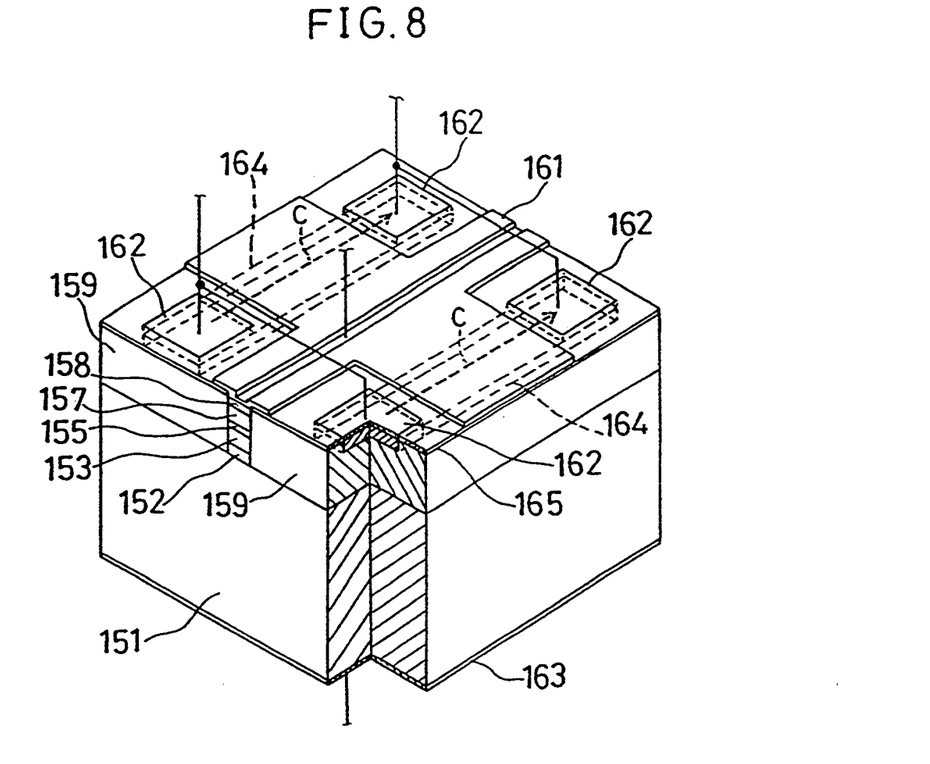
FIG. 8 i a partly broken away perspective view showing the prior art semiconductor laser of FIG. 7.

FIG. 8 is a partly broken away perspective view of a prior art variable wavelength semiconductor laser disclosed in Japanese Published Patent Application 1-173686. In FIG. 8, reference numeral 151 designates a p-type GaAs substrate. A p-type GaAs buffer layer 152 is disposed on the substrate 151, a p-type AlGaAs cladding layer 153 is disposed on the buffer layer 152, a GaAs active layer 155 is disposed on the cladding layer 153, an n-type AlGaAs cladding layer 157 is disposed on the active layer 155, and a p-type GaAs cap layer 158 is disposed on the cladding layer 157. The laminated structure from the cap layer 158 to the buffer layer 152 is formed into a stripe-shaped ridge configuration, and insulating layers 159 are disposed on the substrate 151 at both sides of the ridge. A stripe-shaped resistance layer 164 is disposed parallel to the ridge in the insulating layer 159. An insulating film 165 is disposed covering the insulating layer 159 and the resistance layer 164. This insulating film 165 has apertures at both ends of the resistance layer 164 and temperature control electrodes 162 are disposed on the resistance layer 164 exposed in the apertures. An n side electrode 161 for driving the laser is disposed in contact with the stripe-shaped cap layer 158. Further, a p side electrode 163 is disposed on the rear surface of the substrate 151.

In this prior art laser device, laser oscillation occurs at the active layer 155 from an excitation current injected from the driving electrode 161. Further, by making a current flow through the resistance layer 164 through the electrode 162, as shown by arrows C in the figure, the resistance layer 164 generates heat, the temperature of the active layer 165 is changed, and the laser oscillation wavelength is controlled. The striped-shaped resistance layer 164 is produced in the insulating layer 159 by ion implantation and the resistance value of the insulating layer 159 can be arbitrarily determined by the ion implantation.

The prior art resistance film heating-type variable wavelength laser shown in FIG. 5(a) requires producing an insulating film 107 on the p side electrode 105 and producing a platinum resistance film 108 thereon, resulting in high production costs. In addition, the heat conductivity is inferior because there exists an insulating film 107 between the resistance film 108 and the active layer 102 and, even when the platinum resistance film is heated by a current flow, it takes time for the heat to be transmitted to the active layer, resulting in a delayed change of wavelength in response to the wavelength controlling current.

The variable wavelength lasers of FIGS. 6 and 7 heat a part of a grown layer and require no complicated structure for producing a particular region to be heated. However, the regions to be heated are separated by ten to several tens of microns from the active region, thereby taking time for the transmission of heat to the active region, also delaying a change in wavelength in response to the wavelength controlling current.

Further, the variable wavelength laser of FIG. 8 requires an ion implantation process for producing the resistance layer, and that process is complicated. As in the other prior art devices, the region to be heated is separated by ten to several tens of microns from the active region, thereby requiring time for the heat of the region to be transmitted to the active region, resulting in a delayed change of wavelength in response to wavelength controlling current.

SUMMARY OF THE INVENTION

It is an object of the present invention to provide a semiconductor laser device that can reduce the number of process steps in manufacturing and that has an improved response wavelength change as a function of a wavelength controlling current.

Other objects and advantages of the present invention will become apparent from the detailed description given hereinafter. It should be understood, however, that the detailed description and specific embodiments are given by way of illustration only since various changes and modifications within the spirit and scope of the invention will become apparent to those skilled in the art from this detailed description.

In accordance with one aspect of the present invention, in a semiconductor laser that has an active layer, a cladding layer, and a contact layer, laser oscillation is achieved by injecting a current into a stripe-shaped region of an active layer. A pair of electrodes for making a current flow in a plane parallel to the layers and in a direction perpendicular to the stripe direction are provided at locations directly opposite the stripe-shaped active region. In this semiconductor laser, production is simplified and an improved wavelength change response characteristic as a function of temperature controlling current is obtained.

In accordance with another aspect of the present invention, in a semiconductor laser having a laser light emitting region including an active region and a reflector region including a diffraction grating layer arranged in series with the laser light emitting region in the resonator length direction and in which light having a wavelength matching the period of the diffraction grating is selectively amplified to produce laser oscillation, a pair of electrodes are provided for establishing a current flow in the diffraction grating layer parallel to the layer and in the resonator length direction. In this construction, the oscillation wavelength of a DBR laser can be changed by a change in the temperature of the semiconductor laser including the diffraction grating layer.

DETAILED DESCRIPTION OF THE PREFERRED EMBODIMENTS

Figure 1:
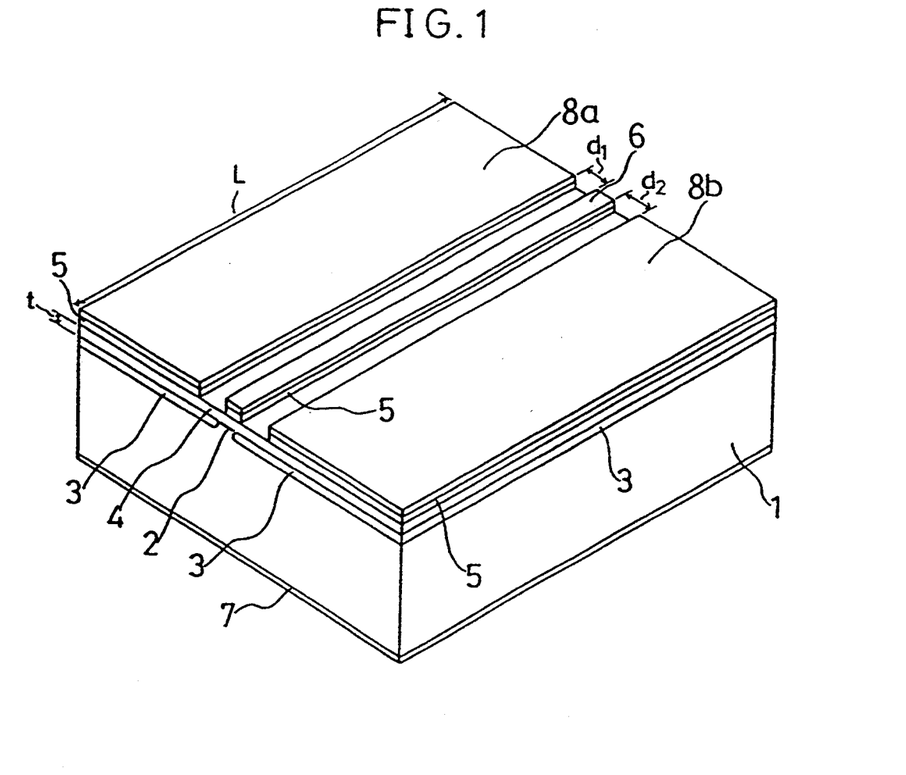
FIG. 1 is a perspective view showing a semi-conductor laser in accordance with a first embodiment of the present invention.

FIG. 1 is a perspective view of a semiconductor laser device in accordance with an embodiment of the present invention. Reference numeral 1 designates an n-type semiconductor substrate. A stride-shaped active layer 2 comprising InGaAsP is disposed on a central portion of the substrate. 1 and semi-insulating current blocking layer 3 comprising Fe doped InP is disposed at both sides of the active layer 2. A cladding layer 4 comprising p-type InP containing Zn as a p-type dopant impurity in a concentration of an order of $10^{18}$cm$^{-3}$ is disposed on the active layer 2 and the current blocking layer 3. A three-part contact layer 5 comprising p-type InP containing Zn in a concentration of an order of $10^{19}$cm$^{-3}$ has two parts that are disposed on the cladding layer 4 and a third part disposed on the cladding layer 4 directly opposite the active layer 2. The third part is separated from the first and second parts by grooves. A p side electrode 6 comprising Ti(50 nm)/Pt(100 nm)/Au(250 nm) for injection a laser driving current is disposed on the third part of the contact layer 5 directly opposite the active layer 2 and electrodes 8a and 8b comprising Ti(50 nm)/Pt(100 nm)/Au(250 nm) for injecting a current into the cladding layer 4 serving as a resistance layer are disposed on the first and second Darts of the contact layer 5. In addition, an n side electrode 7 comprising AuGe(80 nm)/Ni(100 nm)/Au(250 nm) for injecting a laser driving current is disposed on the rear surface of the substrate 1. When a forward direction bias voltage for the p-n junction of the laser is applied between the p side electrode 6 and the n side electrode 7, carriers are injected into and recombine in the active layer 2 to generate light. Here, the current blocking layers 3 confine the current to the active layer 2. The light generated in the active layer 2 is guided along the active layer stripe with repeated reflection and amplification, thereby leading to laser oscillation.

The contact layer 5 is a semiconductor layer introduced to reduce the contact resistance between the semiconductor and the electrodes 8a and 8b and it is a layer of high dopant concentration and low resistance. On the other hand, the p-type InP layer 4 functions as a cladding layer confining carriers and light in the active layer 2 in the usual laser oscillation operation and has a low dopant concentration and high resistance relative to the contact layer. In this embodiment, portions of the contact layer 5 between the electrode 8a and the cladding layer 4 are removed. When a current flows between the electrodes 8a and 8b, heat is generated at the p-type InP cladding layer 4 where the contact layer 5 is absent. This generated heat heats the active layer to change the wavelength of the semiconductor laser. In this way, the semiconductor layer in contact with the active layer generates heat to heat the active layer whereby quite a good wavelength response characteristic as a function of the temperature controlling current which flows between the electrodes 8a and 8b is obtained In producing the semiconductor laser of this embodiment, the same process as that for a usual semiconductor laser can be employed through the production of the contact layer 5. Thereafter, only partial removal of the contact layer 5 is required, making its production quite easy.

The resistance R1 between the electrode 8a and the electrode 8b of the semiconductor laser of FIG. 1 can be obtained from the following formula:

$$R1 = (d/L \cdot t) \cdot w.$$

Here, d designates a sum (d1+d2) of the lengths of portions of the cladding layer 4 where the contact layer 5 is removed in a direction transverse to the electrodes 8a and 8b, L is laser length, t is the layer thickness of the cladding layer 4, and w is the resistivity of the cladding layer 4. In this embodiment, d=20 microns (10 microns+10 microns), w=$10^{-1}\Omega$ cm$^2$, and R1=33$\Omega$. Therefore, when a current of 100 mA flows between the electrodes 8a and 8b, the temperature of the cladding layer becomes about (100mA)$^2 \times$33$\Omega \times$ (thermal resistance (100° CC/W))=33° C. Because the cladding layer 4 is disposed in contact with the active layer 2, the temperature of the active layer also rises about 33° C. The oscillation wavelength is shifted toward a longer wavelength by about 1 Angstrom for each 1° C. temperature rise of the active layer so that the oscillation wavelength is lengthened about 33 Angstroms by a temperature rise of 33° C.

Figure 9:
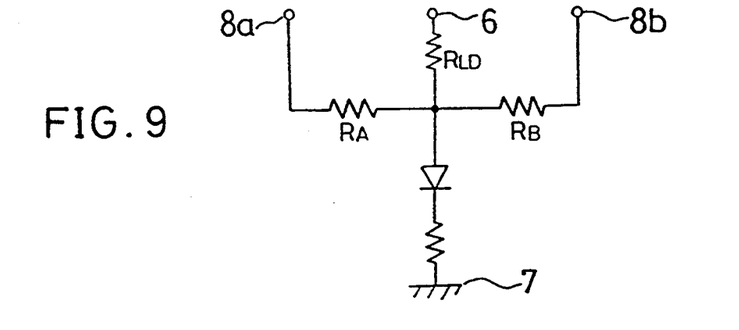
FIG. 9 is a diagram showing an equivalent circuit of the first embodiment of the present invention.

FIG. 9 shows an equivalent circuit of the semiconductor laser of FIG. 1. The same reference numerals as those shown in FIG. 1 designate the same or corresponding parts. Resistors $R_A$ and $R_B$ between the temperature controlling electrode 8a and the p side electrode 6 and between the p side electrode 6 and the temperature controlling electrode 8b, respectively, are portions of cladding layer 4 where the contact layer 5 of FIG. 1 is removed and have a resistance value of 16.5$\Omega$, respectively. The RL$_D$ as a serial resistance component of the laser is a value significantly smaller than the resistances $R_A$ and $R_B$, that is, 16.5$\Omega$. For example, when the voltage $V_{LD}$ for laser light emission is about 1.5 volts and a temperature controlling current of 100 mA flows through the cladding layer, as voltages to be applied to respective electrodes, supposing that the n side electrode 7 is grounded to 0 volts, a $V_{LD}$ of about 1.5 volts should be applied to the p side electrode 6 and $V_{LD}$+1.65 volts, that is, about 3.15 volts, and $V_{LV}$ −1.65 volts, that is, about −0.15 volts, should be applied to the temperature controlling electrodes 8a and 8b, respectively.

Figure 2:
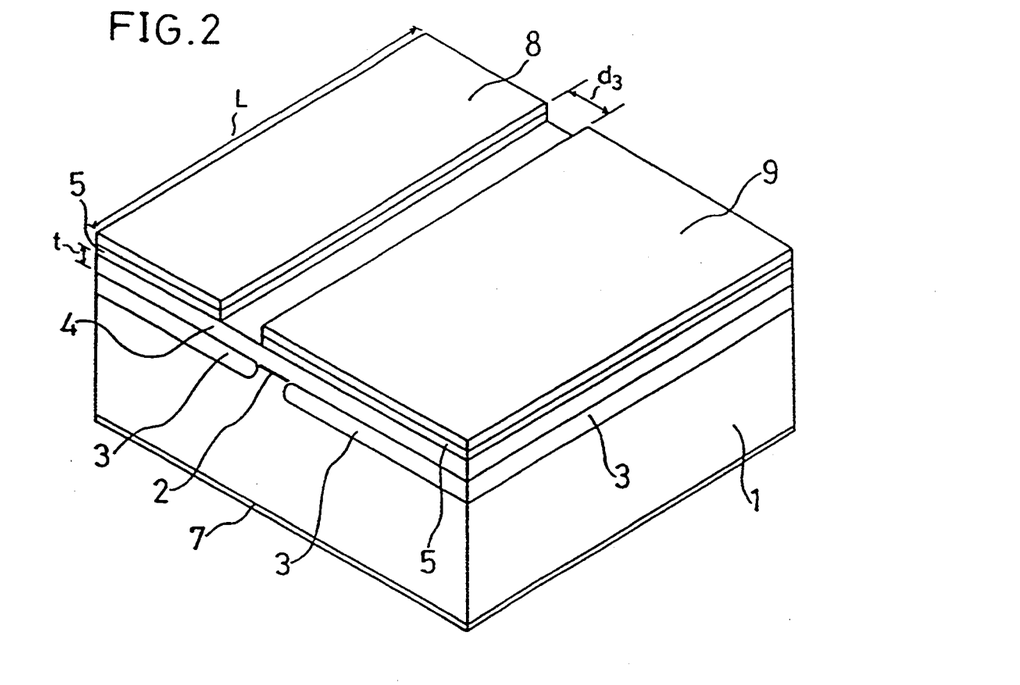
FIG. 2 is a perspective view showing a semiconductor laser in accordance with a second embodiment of the present invention.

FIG. 2 is a perspective view of a semiconductor laser according to a second embodiment of the present invention. In FIG. 2, the same reference numerals designate the same or corresponding parts, reference numeral 8 designates a resistor electrode, and reference numeral 9 desiqnates an electrode serving commonly as a laser electrode and a resistor electrode.

In this second embodiment, a current is made to flow between the common electrode 9 and the n side electrode 7 to produce laser oscillation and a current is made to flow between the resistor electrode 8 and the common electrode 9 to vary the oscillation wavelength.

The laser oscillation operation obtained when a forward bias is applied to the p-n junction of the laser between the common electrode 9 and the n side electrode 7 is the same as in the first embodiment. In the second embodiment, the contact layer 5 between the electrode 8 and the electrode 9 is removed and when a current flows between the electrode 8 and the electrode 9, heat is generated at the portion of the p-type InP cladding layer 4 where the contact layer 5 was removed. The active layer is thereby heated to vary the wavelength of the semiconductor laser. As in the first embodiment, the semiconductor layer in contact with the active layer generates heat to heat the active layer, thereby resulting in quite a good wavelength change characteristic as a function of the temperature controlling current flowing between the electrodes 8 and 9.

The production process for a laser according to the second embodiment, up to the production of the contact layer 5, can be carried out by conventional processing and only the step of partially removing the contact layer 5 to produce the structure of FIG. 2 is added, resulting in quite easy production.

Figure 10:
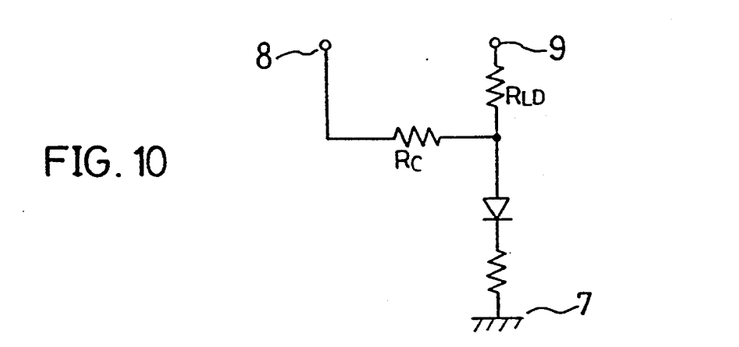
FIG. 10 is a diagram showing an equivalent circuit of the second embodiment of the present invention.

FIG. 10 shows an equivalent circuit of the semiconductor laser of FIG. 2. In FIG. 10, the same reference numerals as those shown in FIG. 2 designate the same or corresponding parts. A resistor $R_c$ between the resistor electrode 8 and the common electrode 9 is produced by a portion of the cladding layer 4 where the contact layer 5 is removed in FIG. 2. In the semiconductor laser of FIG. 2, when the cladding layer 4 comprises the same material as in the first embodiment and, for example, d3=20 microns, L=300 microns, and t=2 microns, $R_c$ amounts to 33Ω. The $R_{LD}$, which is a series resistance component of the laser, has a value significantly smaller than the resistance $R_c$ which is 33Ω.

As in the first embodiment, when the voltage $V_{LD}$ for producing the laser light emission is about 1.5 volts and a temperature controlling current of 100 mA is made to flow through the cladding layer, as voltages to be applied to respective electrodes, supposing the n side electrode 7 is grounded to 0 volts, a $V_{LD}$ of about 1.5 volts should be applied to the p side electrode 6 and $V_{LD}$+3.3 volts, that is, about 4.8 volts, should be applied to the resistor electrode 8.

Since the region to be heated is disposed at only one side of the active layer in this second embodiment, as compared with the first embodiment in which the region to be heated is disposed at both sides of the active layer, the efficiency of heating the active layer is a little inferior to the first embodiment. However, the number of electrodes is reduced, resulting in easy control of the voltage applied.

Figure 3:
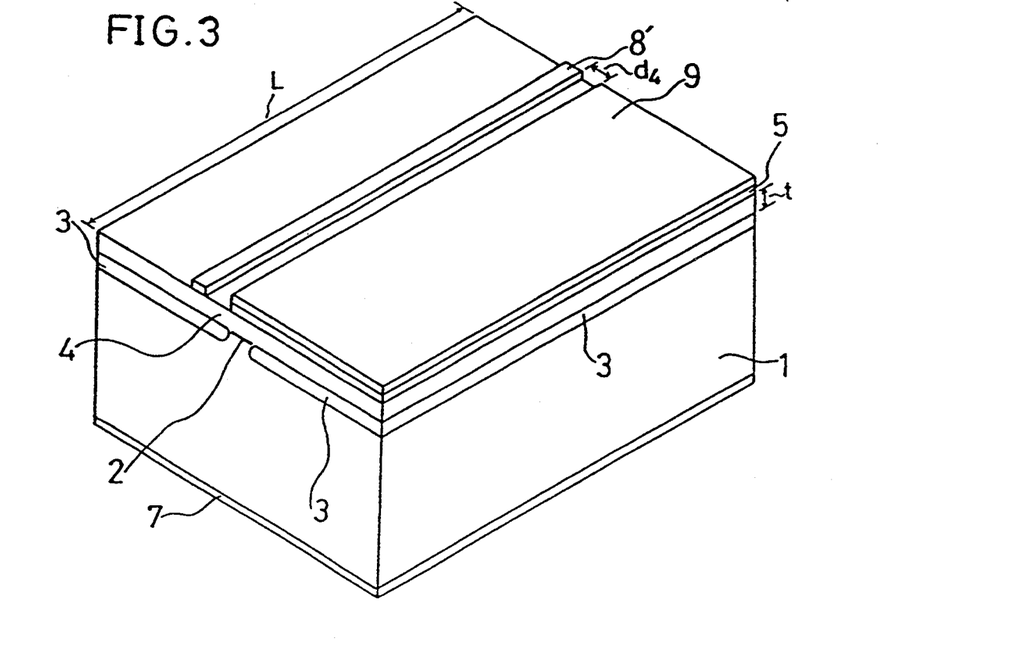
FIG. 3 is a perspective view showing a semiconductor laser in accordance with a third embodiment of the present invention.

FIG. 3 is a perspective view showing a structure of a semiconductor laser in accordance with a third embodiment of the present invention. In FIG. 3, the same reference numerals as those in FIG. 2 designate the same or corresponding parts.

The structure of the third embodiment is almost the same as that of the second embodiment except that the resistor electrode 8 is disposed directly on the cladding layer 4 without placing therebetween a contact layer. To operate the device, as in the second embodiment, a current flows between the common electrode 9 and the n side electrode 7 to produce laser oscillation and, to vary the wavelength, a current flows between the resistor electrode 8 and the common electrode 9.

The laser oscillation operation obtained when a forward bias is applied between the common electrode 9 and the n side electrode 7 is the same as that of the first and second embodiments. In this embodiment, the contact layer 5 at both sides of the stripe-shaped active layer is removed and the resistor electrode 8' is directly disposed on the cladding layer 4 at a predetermined interval d4 from the common electrode 9. Since the contact resistance between the electrode and the semiconductor layer is high when the electrodes are disposed directly on the semiconductor layer having a low dopant impurity concentration, this contact resistance can also be utilized as heating resistance, resulting in an improvement in the thermal efficiency of the active layer. In more detail, when a current is made to flow between the electrode 8' and the common electrode 9, heat is generated at the boundary between the electrode 8' and the resistance layer 4 and at the resistance layer between the electrode 8' and the electrode 9. The active layer is heated by this heat and the wavelength of the semiconductor laser is changed. As in the first and second embodiments, the semiconductor layer in contact with the active layer heats the active layer, thereby resulting in quite a good response characteristic of wavelength change as a function of the temperature controlling current flowing between the electrodes 8 and 9.

In a semiconductor laser according to this embodiment, as in the first and second embodiments, the production process up to the production of the contact layer 5 can be carried out by the same process steps as in the conventional process. Thereafter, only the process steps of partially removing the contact layer 5 and forming the electrode 8' on the exposed cladding layer are carried out to produce the structure of FIG. 3, resulting in quite an easy production.

Figure 11:
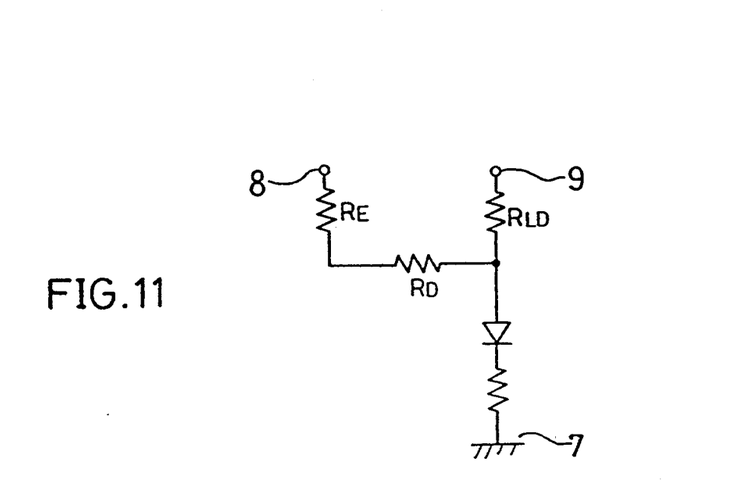
FIG. 11 is a diagram showing an equivalent circuit of the third embodiment of the present invention

FIG. 11 shows an equivalent circuit of the semiconductor laser in FIG. 3. In FIG. 11, the same reference numerals as those shown in FIG. 3 designate the same or corresponding parts. The resistance $R_D$ between the resistor electrode 8 and the common electrode 9 comprises the cladding layer 4 between the resistor electrode 8 and the common electrode 9 in FIG. 3. In the semiconductor laser of FIG. 3, when the cladding layer 4 comprises the same material as in the first embodiment and, for example, d4=200 microns, L=300 microns, and t=2 microns, $R_D$=33Ω. In addition, the resistance $R_E$ is the contact resistance between the electrode 8 and the cladding layer 4 and, for example, is 10Ω in this embodiment. The $R_{LD}$ as a serial resistance component of the laser is significantly smaller than the resistance $R_C$ which is 33Ω.

As in the first and second embodiments, when the voltage $V_{LD}$ for laser light emission is about 1.5 volts and a temperature controlling current of 100 mA flows through the cladding layer, as voltages to be applied to respective electrodes, supposing the n side electrode 7 is grounded to 0 volts, $V_{LD}$ is about 1.5 volts and is applied to the p side electrode 6 and $V_{LD}$+4.3 volts, that is, about 5.8 volts, is applied to the resistor electrode 8.

As is evident from the foregoing description, the temperature controlling current flows to a part in contact with the active region of the semiconductor laser adjacent to the active layer to heat the active region and change the oscillation wavelength, whereby a semiconductor laser having a good wavelength response characteristic as a function of the temperature controlling current is realized.

While in the first to third embodiments InP is used as a substrate and InGaAsP is used as an active layer, another compound semiconductor, such as GaAs, Al- GaAs, or the like, may be used, resulting in the same effect as in the above-described embodiment.

A semiconductor laser capable of changing oscillation wavelength is disclosed in Japanese Published Patent Application 62-247582. The refractive index of a material constituting a diffraction grating is changed by injecting a current into a diffraction grating of a distributed Bragg reflector (DBR) laser whereby oscillation wavelength is changed. This laser utilizes the change in the refractive index according to the plasma effect produced when carriers are injected into a semiconductor layer forming a diffraction grating. It is well known that the refractive index of a semiconductor layer is also changed by a temperature change. Accordingly, the oscillation wavelength of a semiconductor laser can be changed by heating a semiconductor layer of the diffraction grating of a DBR laser.

Figure 4A:
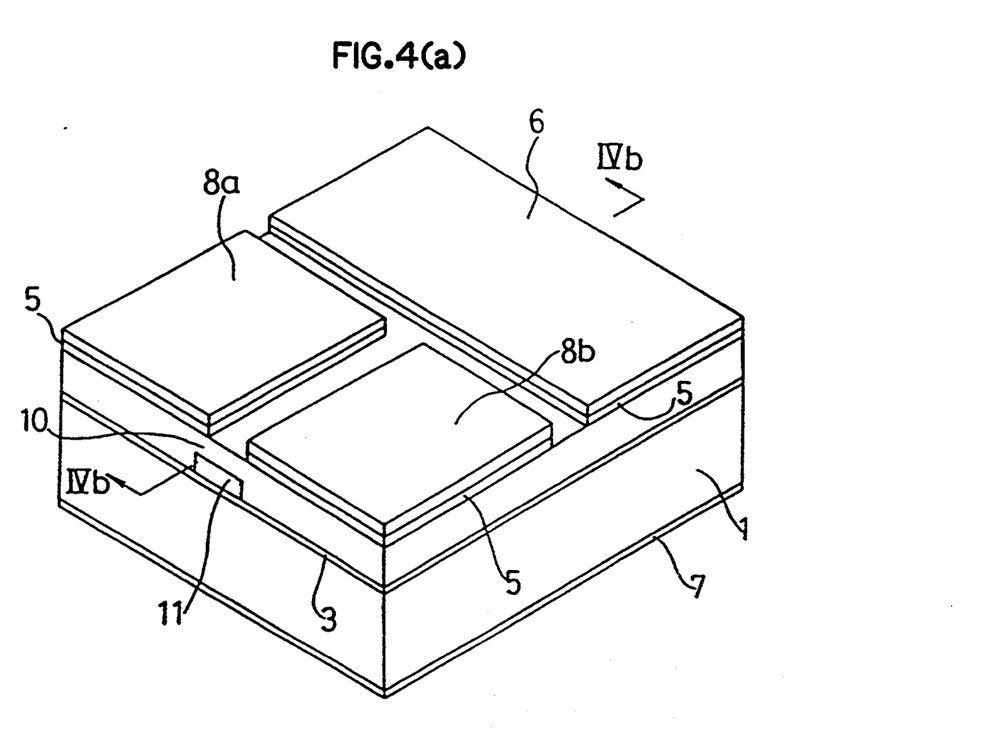
FIG. 4(a) is a perspective view showing a semiconductor laser in accordance with a fourth embodiment the present invention and FIG. 4(b) is a cross-sectional view thereof.
Figure 4B:
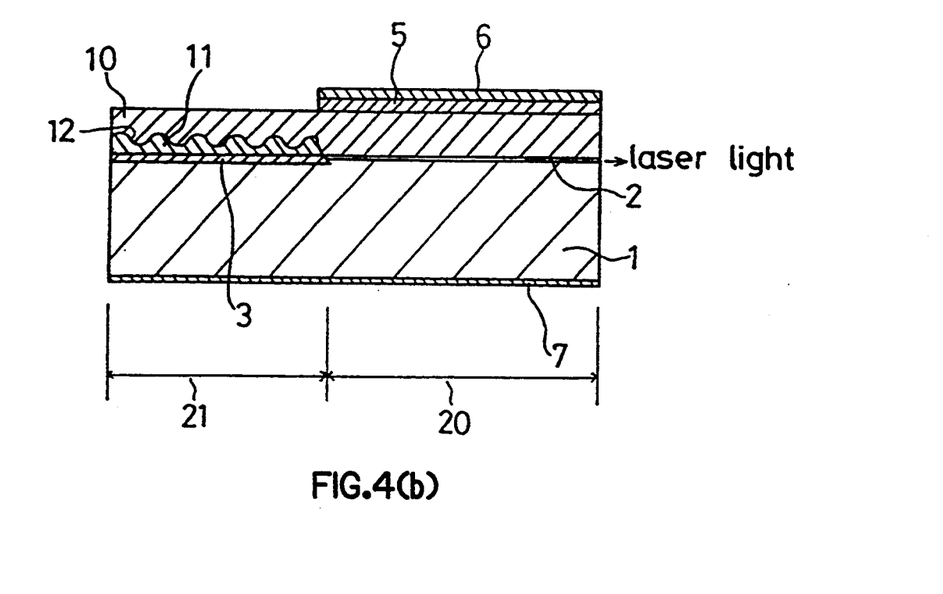

FIG. 4(a) shows a semiconductor laser in which a semiconductor layer forming a diffraction grating of a DBR laser is heated in accordance with a fourth embodiment of the present invention. FIG. 4(a) is a perspective view of the semiconductor laser and FIG. 4(b) is a cross-sectional view of FIG. 4(a) taken along line IVb—IVb. In these figures, the same reference numerals as those shown in FIG. 1 designate the same or corresponding parts. A laser light emitting region 20 and a reflector region 21 including a diffraction grating are arranged serially in the resonator length direction of the DBR laser. A stripe-shaped layer 11 comprising, for example, InGaAsP, is disposed on an extension of the stripe-shaped active layer 2 on the current blocking layer 3 of the reflector region 21 and a periodic uneven structure, that is, a diffraction grating 12, is formed in the resonator length direction on the surface of this InGaAsP layer 11. A p-type semiconductor layer 10 comprising, for example, InP, covers the active layer 2 and the InGaAsP layer 11 on which the diffraction grating is formed. Here, the p-type semiconductor layer 10 in the laser light emitting region functions as a cladding layer that confines light and charge carriers in the active layer 2. The material of the stripe-shaped layer 11 has a different energy band gap from that of the p-type semiconductor layer 10. As described above, since the periodic uneven structure is formed in the resonator length direction on the surface of the stripe-shaped layer 11, a periodic refractive index distribution is produced in the resonator length direction in the reflector region 21.

In the DBR laser, only light having a wave-length matching the period of the diffraction grating of light emitted from the active layer 2 is selectively amplified and produces laser oscillation. In this embodiment, as shown in FIG. 4(a), resistor electrodes 8a and 8b are disposed opposite the diffraction grating 12 in the reflector region 21. A current flows in the direction transverse to the stripe in the p-type semiconductor cladding layer 10 disposed on the InGaAsP layer 11 opposite which the diffraction grating is formed between the electrodes 8a and 8b, thereby making the p-type semiconductor layer 10 generate heat. The refractive index of the p-type semiconductor layer 10 is changed by the generated heat and, further, the period of the diffraction grating 12 is changed due to the thermal expansion of the layers 10 and 11 whereby the oscillation wavelength is changed.

In this fourth embodiment, electrodes for passing a current through the semiconductor layer 10 including a diffraction grating of a DBR laser are disposed on the semiconductor layer 10 and, thus, the oscillation wavelength of the laser can be changed by controlling the current injected from the electrodes.

In the fourth embodiment, a reflector region is provided at one end in the laser light emitting region. Reflector regions can be provided at both ends of the laser light emitting region with the same effects as in the above-described embodiment.

In the fourth embodiment, InP is used as a substrate and InGaAsP is used as an active layer, as in the first and third embodiments. Other compound semiconductors, such as GaAs, AlGaAs, or the like, can be used with the same effects as in the above-described embodiment.

As is evident from the foregoing description, according to the present invention, in a semiconductor laser which has an active layer, a cladding layer, and a contact layer which are successively disposed on a substrate and in which laser oscillation is produced by injecting a current into a stripe-shaped region of the active layer, a pair of electrodes for passing a current in a direction parallel to the layers and in a direction perpendicular to the stripe direction are provided in contact with a portion of the cladding layer directly opposite the stripe-shaped active region. Therefore, a semiconductor laser, the production of which is easy and which provides a preferable wavelength change response characteristic as a function of a temperature controlling current is obtained.

According to another aspect of the present invention, in a semiconductor laser that has a laser light emitting region including an active layer and a reflector region including a diffraction grating arranged in series with the laser light emitting region in the resonator length direction and in which light having a wavelength matching the period of the diffraction grating is selectively amplified to produce laser oscillation, a pair of electrodes for passing current in a direction parallel to the layers and in a direction perpendicular to the resonator length direction in a semiconductor layer including a diffraction grating are provided in the reflector region. Therefore, in this semiconductor laser, the oscillation wavelength of a DBR laser can be changed by changing the temperature of the semiconductor layer including the diffraction grating.

What is claimed is:

1. A semiconductor laser device comprising:
    a semiconductor substrate;
    an active layer having a stripe-shaped region, a cladding layer, and a contact layer successively disposed on said semiconductor substrate;
    means for injecting a current into said stripe-shaped region of said active layer to produce a laser light emission; and
    a pair of electrodes for passing a current through said cladding layer parallel to said cladding and contact layers and perpendicular to said stripe-shaped region, disposed adjacent said cladding layer and opposite said stripe-shaped region.

2. The semiconductor laser device of claim 1 wherein said means for injecting a current includes a laser driving electrode disposed on said contact layer opposite said active layer, said pair of electrodes are disposed on said contact layer, and said contact layer is absent between said pair of electrodes except where said laser driving electrode is present.

3. The semiconductor laser device of claim 2 wherein at least one is disposed directly on said cladding layer where said contact layer is absent.

4. The semiconductor laser device of claim 2 wherein one of said pair of electrodes is also said laser driving electrode.

5. The semiconductor laser device of claim 3 wherein one of said pair of electrodes is also said laser driving electrode.

6. A semiconductor laser device comprising:
a light emitting region including an active layer extending along a resonator length;
a reflector region including a diffraction grating having a period arranged in series with said light emitting region along the resonator length, light generated in said light emitting region and having a wavelength matching the period of said diffraction grating being selectively amplified to produce a laser oscillation; and
a pair of electrodes for passing a current through a semiconductor layer opposite said diffraction grating in a direction parallel to said active layer and perpendicular to the resonator length, said pair of electrodes being disposed on said semiconductor layer opposite said diffraction grating in said reflector region.

7. The semiconductor laser device of claim 6 including a contact layer wherein said pair of electrodes for passing a current through said semiconductor layer are disposed on said contact layer and said contact layer is absent between said pair of electrodes and between said light emitting region and said reflector region.

8. A semi conductor laser comprising:
a semiconductor substrate;
a semiconductor current blocking layer disposed on the substrate and including a gap having a stripe shape;
a semiconductor active layer disposed on the current blocking layer and on the substrate in the gap;
a semiconductor cladding layer disposed on the active layer;
a semiconductor contacting layer disposed on the cladding layer and including at least one gap separating the contacting layer into first and second parts;
a first electrode disposed on the substrate; and
second and third electrodes disposed on the first and second parts of the contacting layer, respectively, for conducting a current through the cladding layer, thereby heating the active layer.

9. The semiconductor laser of claim 8 wherein the gap between the first and second parts of the contacting layer is generally parallel to the gap in the current blocking layer.

10. The semiconductor laser of claim 8 wherein a portion of the first part of the contacting layer is disposed directly opposite the gap in the current blocking layer.

11. The semiconductor laser of claim 8 wherein the gap in the current blocking layer is disposed directly opposite the gap in the contacting layer and wherein the contacting layer includes a third part disposed between and spaced from the first and second parts of the contacting layer on the cladding layer and a fourth electrode disposed on the third part of the contacting layer.

12. A semiconductor laser comprising:
a semiconductor substrate;
a semiconductor current blockout layer disposed on the substrate and including a gap having a stripe shape;
a semiconductor active layer disposed on the current blocking layer and on the substrate in the gap;
a semiconductor cladding layer disposed on the active layer;
a semiconductor contacting layer disposed on part of the cladding layer including directly opposite the gap in the current blocking layer;
a first electrode disposed on the substrate; and
a second electrode disposed on the contacting layer and a third electrode disposed on the cladding layer spaced from the contacting layer, the first and second electrodes for conducting a current through the cladding layer, thereby heating the active layer.

13. A semiconductor laser structure including:
a semiconductor substrate having opposed first and second surfaces;
a first electrode disposed on the first surface of the substrate; and
a light emitting region and a reflector region disposed on the second surface of the substrate and contiguous with each other, the light emitting region including: a semiconductor current blocking layer disposed on the substrate having a stripe-shaped gap and extending into the reflector region; a semiconductor active layer disposed on the current blocking layer and on the substrate in the gap; a semiconductor cladding layer disposed on the active layer and extending into the reflector region; a first part of a semiconductor contacting layer disposed on the cladding layer and extending into the reflector region; and a second electrode disposed on the first part of the contacting layer for establishing a current flow between the first and second electrodes to generate light at the active layer; the reflector region including: part of the current blocking layer in the stripe-shaped gap; a stripe-shaped semiconductor layer disposed on the current blocking layer aligned with the gap, extending from the active layer, and having a periodic thickness variation opposite the current blocking layer; part of the cladding layer disposed on the stripe-shaped semiconductor layer and forming a diffracting grating at an interface with the cladding layer; second and third parts of the contacting layer disposed on the cladding layer separated from each other and from the first part of the contacting layer with the stripe-shaped semiconductor layer between the second and third parts of the contacting layer; and third and fourth electrodes disposed on the second and third parts of the contacting layer, respectively, for conducting a current through the cladding layer, thereby heating the diffraction grating.

* * * * *

UNITED STATES PATENT AND TRADEMARK OFFICE
CERTIFICATE OF CORRECTION

PATENT NO. : 5,341,391

DATED : August 23, 1994

INVENTOR(S) : ISHIMURA

It is certified that error appears in the above-identified patent and that said Letters Patent is hereby corrected as shown below:

Column 11, line 2, after "one" insert --of said pair of electrodes--.

Signed and Sealed this

Twenty-ninth Day of November, 1994

Attest:

BRUCE LEHMAN

Attesting Officer

Commissioner of Patents and Trademarks